US008277064B2

(12) United States Patent
Willemsen et al.

(10) Patent No.: US 8,277,064 B2
(45) Date of Patent: Oct. 2, 2012

(54) LIGHT SOURCE AND ILLUMINATION SYSTEM HAVING A PREDEFINED EXTERNAL APPEARANCE

(75) Inventors: Oscar Hendrikus Willemsen, Eindhoven (NL); Marcellinus Petrus Carolus Michael Krijn, Eindhoven (NL); Michel Cornelis Josephus Marie Vissenberg, Eindhoven (NL); Ramon Pascal Van Gorkom, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 328 days.

(21) Appl. No.: 12/742,694

(22) PCT Filed: Nov. 13, 2008

(86) PCT No.: PCT/IB2008/054755
§ 371 (c)(1),
(2), (4) Date: May 13, 2010

(87) PCT Pub. No.: WO2009/066206
PCT Pub. Date: May 28, 2009

(65) Prior Publication Data
US 2010/0265692 A1    Oct. 21, 2010

(30) Foreign Application Priority Data
Nov. 19, 2007 (EP) .................... 07120967

(51) Int. Cl.
*F21V 9/16* (2006.01)
(52) U.S. Cl. .......................... 362/84; 362/360; 362/294
(58) Field of Classification Search .............. 362/84, 362/260, 294, 296.01, 311.02, 345
See application file for complete search history.

(56) References Cited

U.S. PATENT DOCUMENTS

| | | | |
|---|---|---|---|
| 7,196,354 B1 | 3/2007 | Erchak et al. | |
| 2004/0046178 A1 | 3/2004 | Sano | |
| 2005/0201109 A1 | 9/2005 | Shimura | |
| 2005/0270775 A1 | 12/2005 | Harbers et al. | |
| 2006/0091779 A1 | 5/2006 | Takeda et al. | |

(Continued)

FOREIGN PATENT DOCUMENTS
DE   19845229 C1   3/2000
(Continued)

*Primary Examiner* — David V Bruce
(74) *Attorney, Agent, or Firm* — Mark L. Beloborodov

(57) ABSTRACT

The invention relates to a light source and an illumination system. The light source (10) comprises a light emitter (20) and a light conversion element (30). The light emitter emits visible light of a first color through the light conversion element in a direction away from the light source. The light conversion element comprises a photoluminescent material (40) for converting at least a part of the light of the first color into light of a second color different from the first color. The light source further comprises conversion material (42) for converting at least a part of ambient light impinging on the conversion material into light of a third color (Ba) different from the second color. When the light emitter emits light, the color of the light emitted is mainly a mixture of the light of the first color and light of the second color. When the light emitter does not emit light, the color of the light emitted by the light source is determined by the reflected ambient light, light of the second color and light of the third color. As such, the color of the light source can be tuned when the light emitter does not emit light and can, for example, be made substantially identical to the color of the light emitted when the light emitter emits light.

11 Claims, 5 Drawing Sheets

| U.S. PATENT DOCUMENTS | | | | FOREIGN PATENT DOCUMENTS | | |
|---|---|---|---|---|---|---|
| 2006/0239006 A1 | 10/2006 | Chaves et al. | | EP | 1394867 A2 | 3/2004 |
| 2007/0145397 A1 | 6/2007 | DenBaars et al. | | EP | 1566426 A2 | 8/2005 |
| 2009/0278448 A1* | 11/2009 | Tchakarov | 313/504 | WO | 2007039849 A1 | 4/2007 |
| 2011/0164431 A1* | 7/2011 | Anandan | 362/606 | * cited by examiner | | |

LIGHT SOURCE AND ILLUMINATION SYSTEM HAVING A PREDEFINED EXTERNAL APPEARANCE

FIELD OF THE INVENTION

The invention relates to a light source having a predefined external appearance during non-operation.

The invention also relates to an illumination system comprising the light source.

BACKGROUND OF THE INVENTION

Light sources are known per se. They are used, inter alia, in all kinds of illumination systems, for example, for use as general illumination system in shops and offices, or, for example, for use as illumination system in projection devices such as beamers and projection televisions, or, for example, for use as backlight illumination system in display devices, such as liquid crystal display devices. The light source may also include a luminescent material for determining a color of the light emitted by the light source. Light sources which use luminescent material for determining the color of the emitted light comprise light sources having a light emitter which emits non-visible light and a light emitter which emits visible light.

In the known embodiment of the light source having a light emitter which emits non-visible light, the non-visible light is substantially completely converted into visible light by the luminescent material which determines the color of the visible light emitted by the light source. Such a light emitter, for example, emits ultraviolet light, which is converted by a luminescent material into visible light. The luminescent material typically comprises a mixture of luminescent materials, which mixture of luminescent materials determines the color of the visible light emitted by the light source. Examples of such light sources having a light emitter which emits non-visible light are, for example, low pressure mercury vapor discharge lamps which emit ultraviolet light towards the luminescent layer, which converts the ultraviolet light into visible light.

In the known embodiment of the light source which comprises a light emitter which emits visible light, only a part of the light from the light emitter is converted by the luminescent material and the remainder of the light from the light emitter is combined with the converted light to determine the color of the visible light emitted by the light source. Again, the luminescent material may comprise a mixture of different luminescent materials to tune the color of the light emitted by the light source. A major benefit of this embodiment is that the efficiency of the light emitted by the light source is increased due to the reduction of the light conversion. When luminescent materials are used to convert light from one color into a further color, loss of light occurs due to the Stokes shift. When using part of the light emitted by the light emitter, this light need not be converted into a different color, thus reducing the loss due to the Stokes shift and improving the efficiency of the light source. Especially due to the development of Blue LEDs and Blue Laser-LEDs, these types of light sources having a light emitter which emits visible light have become very popular.

However, a drawback of the known light source having a light emitter emitting visible light, is that generally the light source does not have the same color appearance during non-operation as during operation. This results from the configuration of the light source being such that the light emitted by the light emitter is emitted away from the light source via the luminescent material, which generally is applied as a luminescent layer on top of the light emitter. As a consequence, the appearance of the light source is mainly determined by the appearance of the luminescent material. For example, when the light source has a light emitter which emits blue light via a luminescent layer which converts part of this blue light into yellow light, the light source emits substantially white light during operation, while the appearance of the light source during non-operation is substantially yellow due to the luminescent material.

A solution to this difference in appearance during operation and non-operation may, for example, be found in US patent application US 2005/0201109. In this patent application a lighting apparatus is disclosed which comprises a support, a light source having an emission surface and, disposed in the support, a lens disposed to face the emission surface of the light source. A half-mirror film is provided on at least a surface of the lens. The half-mirror film prevents viewing the inside of the lighting apparatus from the outside using external light when light is not being emitted from the light source.

A drawback of this known lighting apparatus is that such a half-mirror film can only be used efficiently in a relatively limited wavelength range. When substantially all external light should be blocked from entering the light source, the half-mirror film will also block part of the light from being emitted from the lighting apparatus, thus reducing the efficiency of the known lighting apparatus significantly.

SUMMARY OF THE INVENTION

It is an object of the invention to provide a light source having a predetermined appearance when no light is emitted, while maintaining a substantially high efficiency.

According to a first aspect of the invention, the object is achieved with a light source comprising a light emitter and a light conversion element, the light emitter emitting visible light of a first color via the light conversion element in a direction away from the light source, the light conversion element comprising a luminescent material for converting at least a part of the light of the first color into light of a second color different from the first color, the light source further comprising conversion material for converting at least a part of ambient light impinging on the conversion material into light of a third color different from the second color, the ambient light being light originating from outside the light source.

During operation of the light source, the light emitted by the light source comprises light of the first color emitted by the light emitter, light of the second color originating from the luminescent material and emitted by the light conversion element, and light of the third color originating from ambient light impinging on the conversion material. Because the intensity of the ambient light which originates from outside the light source generally is several orders of magnitude lower than the intensity of the light generated by the light emitter, the contribution of the light of the third color to the color of the light emitted by the light source is very low and thus the color is mainly determined by a mixture of light of the first color and light of the second color. When the light emitter in the light source does not emit light of the first color or, in other words, the light source is non-operational, the light emitted by the light source originates from ambient light which enters the light source. Part of the ambient light may be light of the first color which impinges on the light conversion element and part thereof is converted by the luminescent material into light of the second color. Furthermore, the light source comprises conversion material for converting at least a part of the ambient light impinging on the conversion material into light of a third color, different from the second color. Now, the contribution of the third color to the light emitted by the light source is not negligible and contributes to the color of the light emitted by the light source during non-operation. As a consequence, during non-operation, the light emitted by the light source and determining the appearance of the light source during non-operation comprises reflected ambient light, light of the second color and light of the third color. Choosing the light of the third color enables the predetermined appearance of the light source during non-operation to be achieved, while omitting the need for a half-mirror, thus improving the efficiency of the light source.

The luminescent material of the light conversion element may be a mixture of different luminescent materials which each absorb the first color and subsequently convert the first color into respective further colors. The light of the plurality of further colors, when mixed, generates light of the second color. The light emitter may also comprise a plurality of light emitters, of which some of the plurality of light emitters emit light of a different color. The light of the plurality of light emitters, when mixed, generates the light of the first color.

When, for example, the first color of the light is blue light emitted by the light emitter and when, for example, the luminescent material converts part of the blue light into yellow light (being the light of the second color), the light emitted by the light source is substantially white. However, the appearance of the light source, when looking into the light source, is a different color and is determined by the color of the luminescent material which converts part of the ambient light into yellow light, giving the light source a yellow appearance. Adding the conversion material, which converts part of the ambient light into light of the third color, the appearance can be tuned. For example, the conversion material converts part of the ambient light into blue light, compensating for the omitted blue light from the light emitter. Such a light source has a substantially white appearance both during operation and non-operation.

In this context, light of the first color, the second color or the third color typically comprises light having a predefined spectrum. The predefined spectrum may, for example, comprise a primary color having a specific bandwidth around a predefined wavelength, or may, for example, comprise a plurality of primary colors. The predefined wavelength is a mean wavelength of a radiant power spectral distribution. The light of a primary color, for example, includes Red, Green, Blue, Yellow, Amber, and Magenta light. Light of the first color, the second color or the third color may also comprise mixtures of primary colors, such as Blue and Amber, or Blue, Yellow and Red. By choosing, for example, a specific combination of the Red, Green and Blue light substantially every color can be generated by the light source, including white. Also other combinations of primary colors may be used in the light source, which enables the generation of substantially every color, for example, Red, Green, Blue, Cyan and Yellow.

In an embodiment of the light source, the conversion material is applied in a layer that is at least partially applied on a surface of the light conversion element facing away from the light emitter. A benefit of this embodiment is that the conversion material may relatively easily be applied as the layer on the light conversion element. The layer comprising the conversion material may be applied on the light conversion element by means of various known deposition and/or printing techniques, depending on the conversion material used in the light source.

In an embodiment of the light source, the conversion material is configured to absorb at least part of the impinging ambient light and reflect the remainder of the impinging ambient light for generating the third color. Such a conversion material, for example, may be paint or ink which may be applied on the light conversion element. A benefit of this embodiment is that the paint or ink may be relatively easy to apply, for example, using ink-jet printing.

In an embodiment of the light source, the conversion material comprises a further luminescent material substantially shielded from direct impinging light emitted by the light emitter, the further luminescent material converting at least part of the impinging ambient light into light of the third color. A benefit of this embodiment is that it allows the third color to be a color which is not present in the ambient light impinging on the light conversion element, for example, when the ambient light is artificial light which does not comprise a full spectrum of the black body radiator. Furthermore, the use of the further luminescent material enables an active generation of the color of the light source during non-operation, compared to only absorption of part of the light impinging on the layer and reflecting the remainder of the impinging light. Choosing the further luminescent material enables the generation of substantially any color appearance of the light source during non-operation.

In an embodiment of the light source, the conversion material is applied to the surface of the light conversion element in a regular pattern of conversion material having openings in between adjacent parts of conversion material, through which light of the first color and light of the second color can be emitted from the light conversion element. A benefit of this embodiment is that it allows the light of the first color and the second color generated during operation to pass the conversion material substantially unhindered.

In an embodiment of the light source, the light source comprises light guiding elements for guiding light of the first color away from the conversion material towards the luminescent material. The light guiding elements may, for example, guide the light of the first color via total internal reflection, which reduces guidance losses compared to when the light guiding elements comprise a mirror surface for guiding the light of the first color. A benefit of this embodiment is that it prevents that the light of the first color and of the second color are recycled inside the light source. Recycling of light always generates some loss of light, so by preventing the recycling of light, the efficiency of the light source is improved.

In an embodiment of the light source, the relative dimension between the conversion material and the openings in the regular pattern is selected so as to prevent that the regular pattern is visible to the human eye, both during operation and non-operation. With preventing the regular pattern from being visible to the human eye is meant that the regular pattern is not visible to the human eye, provided that the human does not use magnifying means to more specifically inspect the light source. A benefit of this embodiment is that the external appearance of the light source is perceived as homogeneous, for example, having a homogeneous color.

In an embodiment of the light source, a mirror layer is applied in a similar regular pattern as the conversion material, the mirror layer being arranged between the conversion material and the light emitter for improving the efficiency of the light source by recycling light of the first color and light of the second color.

In an embodiment of the light source, a part of the luminescent material is applied between the mirror layer and the light emitter. A benefit of this embodiment is that it increases the surface of the luminescent material and thus increases the efficiency of conversion of light of the first color into light of the second color by spreading the conversion of light of the first color into light of the second color over a larger area. Due to the spreading of the conversion of light of the first color into light of the second color over a larger area, the operational temperature of the luminescent material in the light conversion element is reduced, increasing the efficiency of the luminescent material.

In an embodiment of the light source, the regular pattern of conversion material is chosen for improving the cooling of the luminescent material in the light conversion element. The regular pattern may, for example, be wavy or straight lines of conversion material which, for example, improve an air stream, possibly via a fan, to cool the luminescent material. Alternatively, when the regular pattern of the conversion material also comprises a substantially identical pattern of mirrors, the mirrors may also function as a heat conductor, because the mirrors typically comprise a metal layer which conducts heat relatively easily. The mirrors, for example, conduct the heat away from the light conversion element, for example, towards a heat sink. Generally, in operation, the temperature of the luminescent material is relatively high, even when the light conversion element is located remote from the light emitter. This typically limits the efficiency of the luminescent material and limits the choice of applicable luminescent materials which can be used in the light conversion element. By arranging the pattern such that it improves the cooling of the luminescent material, the pattern, during operation, enhances the cooling while, during non-operation, the pattern contributes to the external appearance of the light source.

In an embodiment of the light source, the conversion material comprises a further luminescent material that substantially does not absorb the first color. A benefit of this embodiment is that the further luminescent material does not need to be shielded from light of the first color. This provides considerably more design freedom in providing the further luminescent material on or in the light source or the light conversion element determining the external appearance of the light source during non-operation.

In an embodiment of the light source, the further luminescent material is mixed with the luminescent material in the light conversion element. A benefit of this embodiment is that by virtue of the mixture of the further luminescent material and the luminescent material, no structure of the further luminescent material in the light conversion element is visible. In operation, the luminescent material converts part of the light of the first color into light of the second color. The further luminescent material only marginally contributes by converting part of the ambient light into light of the third color. When the light emitter does not emit light, part of the impinging ambient light may be converted by the luminescent material into light of the second color. A further part of the ambient light will be converted by the further luminescent material into light of the third color. Due to the mixture of the further luminescent material and the luminescent material in the light conversion element, both light of the second color and light of the third color will emit from the light source during non-operation, due to the impinging ambient light which generates a homogeneous outside color appearance of the light source.

In an embodiment of the light source, the light conversion element is arranged remote from the light emitter. The light source comprises a so called remote phosphor arrangement. A benefit of this embodiment is that the surface area of the luminescent material can be made larger than that of the light emitter. As a result, the probability that the light is scattered back to the light emitter is reduced, thus reducing light re-absorption. Hence, remote phosphor can increase the system efficiency. It is estimated that the increase of efficiency can be up to 60%. Furthermore, due to the larger area, the light flux per area is smaller. This increases the variety of luminescent materials which can be used in the light conversion element. Another advantage when applying a remote phosphor arrangement in general lighting applications is that the brightness of the light emitted is decreased before it leaves the light source.

In an embodiment of the light source, the light source further comprises a diffuser arranged at a side of the light conversion element facing away from the light emitter. The diffuser may be used to, for example, diffuse the regular pattern of conversion material to provide the light source with an appearance such that the color is substantially homogeneous, while the regular pattern may remain relatively large.

The invention also relates to an illumination system as claimed in claim 15.

BRIEF DESCRIPTION OF THE DRAWINGS

These and other aspects of the invention are apparent from and will be elucidated with reference to the embodiments described hereinafter.

In the drawings:

FIGS. 1A, 1B, 1C, 1D, and 1E show a simplified cross-sectional view of light sources according to the invention, FIGS. 2A, 2B, 2C and 2D each show the conversion of light when the light emitter is 'on' or 'off', wherein

The figures are purely diagrammatic and not drawn to scale. Particularly for clarity, some dimensions are exaggerated strongly. Similar components in the figures are denoted by the same reference numerals as much as possible.

DETAILED DESCRIPTION OF EMBODIMENTS

Figure 1A:
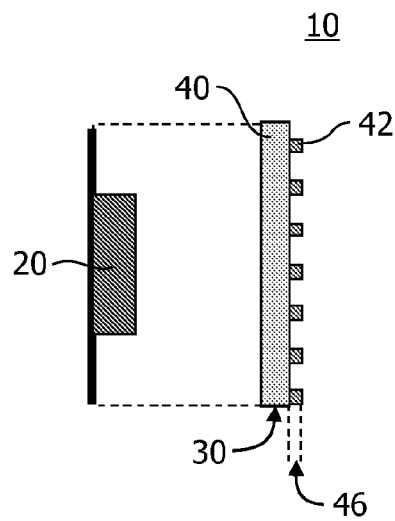

FIGS. 1A, 1B, 1C, 1D, and 1E show a simplified cross-sectional view of light source 10, 12, 14, 16, 18 according to the invention. The light source 10, 12, 14, 16, 18 according to the invention comprises a light emitter 20, a light conversion element 30, 32, 34, 36, 38 and conversion material 42, 44. The light emitter 20 emits visible light of a first color Be (see FIGS. 2A and 2C) via the light conversion element 30, 32, 34, 36, 38 in a direction away from the light source 10, 12, 14, 16, 18. The light conversion element 30, 32, 34, 36, 38 comprises a luminescent material 40 which converts at least a part of the impinging light of the first color Be into light of a second color Y1, Y2 (see FIGS. 2A and 2C) which is different from the light of the first color Be. The conversion material 42, 44 converts at least a part of the impinging ambient light A (see FIGS. 2C and 2D) into light of a third color Ba (see FIGS. 2C and 2D) which is different from the second color Y1, Y2.

For example, the first color Be emitted by the light emitter 20 is the color Blue. The light conversion element 30, 32, 34, 36, 38 comprises luminescent material 40 which converts at least part of the blue light Be from the light emitter 20 into light of the second color Y1, Y2, for example, Yellow light Y1, Y2. When the light emitter 20 is emitting light, or, in other words, during operation of the light source 10, 12, 14, 16, 18, the light source 10, 12, 14, 16, 18, emits the remainder of the Blue light Be together with the converted Yellow light Y1, Y2, resulting in the emission of substantially White light. The light source 10, 12, 14, 16, 18, further comprises the conversion material 42, 44. This conversion material 42, 44 converts part of the ambient light A into light of the third color Ba, for example, again in light having the color Blue Ba. The light having the color Blue generated by the conversion material 42, 44 due to the ambient light A may have substantially the same Blue color Be or may have a different Blue color, meaning light having a different shade of Blue compared to the color emitted by the light emitter 20. As a result, during operation, the color of the light emitted by the light source 10, 12, 14, 16, 18, is substantially White due to the emission of light of the first color Be and light of the second color Y1, Y2, and during non-operation, the color of the light emitted by the light source 10, 12, 14, 16, 18, is again substantially White due to the emission of light of the second color Ya1, Ya2 (see FIGS. 2C and 2D) and of the third color Ba resulting from the impinging ambient light A.

The light emitter 20 may be any suitable light emitter 20 emitting visible light, such as an incandescent lamp (not shown), a high pressure discharge lamp (not shown), and a low pressure discharge lamp (not shown). Preferably, the light emitter 20 is a light emitting diode 20 or a laser diode 20, because these light emitters 20 emit a relatively narrow spectrum of light which is ideal for partial conversion by the luminescent material 40 of the light conversion element 30, 32, 34, 36, 38.

The first color, for example, is blue, the second color is yellow and the third color again may be blue.

The conversion material 42 may, for example, be ink 42 or paint 42. In such an embodiment, the ink 42 or paint 42 may reflect only a part of the impinging ambient light A, for example the part of the ambient light A having the color blue Ba, and absorb substantially the remainder of the impinging ambient light A. As such, the perceived color of the light source 10, 14, 16 according to the invention is white during operation and white during non-operation.

Alternatively, for example, the conversion material 42, 44 is a further luminescent material 42, 44. In such an embodiment, the further luminescent material 42, 44 may, for example, use a part of the ambient light A and convert it into, for example, light of the color blue Ba. In a first embodiment of the further luminescent material 42, the arrangement of the further luminescent material 42 should be shielded from directly impinging light of the first color Be, because part of this light may interact with the further luminescent material 42. The prevention of the directly impinging light of the first color Be may be obtained by placing a mirror surface 50 between the further luminescent material 42 and the light emitter 20 (see FIGS. 4A and 4B). The conversion material 42 may, for example, be applied on the light conversion element 30, 36 in a regular pattern (see FIGS. 3A to 3D). This regular pattern alternates the conversion material 42 and the luminescent material 40 and may be relatively large and well visible to provide a specific appearance of the light source 10, 14, 16. The light emitted from the light source 10, 14, 16 during operation may, for example, have a substantially uniform white color, while during non-operation, the light source 10, 14, 16 may comprise a recognizable structure or image, for example, representing a logo of a company.

Alternatively, the further luminescent material 44 may be chosen such that it substantially does not absorb light of the first color Be. In such an embodiment, the further luminescent material 44 may be mixed with the luminescent material 40. This further luminescent material 44 may, for example, absorb violet light or even a part of the ultraviolet light of the ambient light A and convert this into blue light Ba to ensure that the color appearance of the light emitted during non-operation is also white.

In the examples above, the third color Ba is chosen such that the appearance of the light source 10, 12, 14, 16, 18 both during operation and non-operation is substantially equal, for example, white. Alternatively, the color of the appearance of the light source 10, 12, 14, 16, 18 during non-operation may be completely different than the color emitted by the light source 10, 12, 14, 16, 18 during operation. By choosing a specific third color Ba and an appropriate intensity of the third color Ba compared to the impinging ambient light A, the external appearance of the light source 10, 12, 14, 16, 18 may be converted into substantially any color.

FIG. 1A shows a first embodiment of the light source 10 according to the invention, in which the conversion material 42 is applied on the surface of the light conversion element 30 facing away from the light emitter 20. The conversion material 42 is applied in a layer 46 in a regular pattern in which holes between areas of conversion material 42 enable the light of the first color Be and light of the second color Y1, Y2 to be emitted from the light source.

Figure 1B:
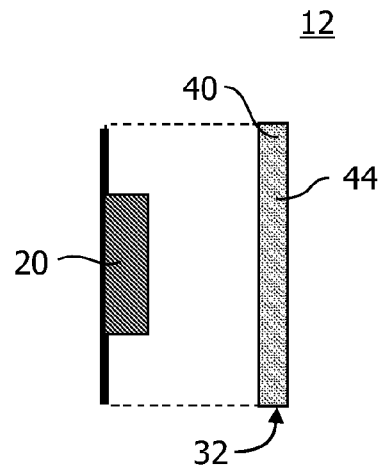

FIG. 1B shows a second embodiment of the light source 12 according to the invention. In this embodiment the conversion material 44 is a further luminescent material 44 which substantially does not absorb light of the first color Be. As a consequence, the further luminescent material 44 may be mixed with the luminescent material 42 of the light conversion element 32. A benefit of this embodiment is that the color appearance during non-operation of the light source 12 is substantially homogeneous due to the mixing of the luminescent material 42 and the further luminescent material 44.

Figure 1C:
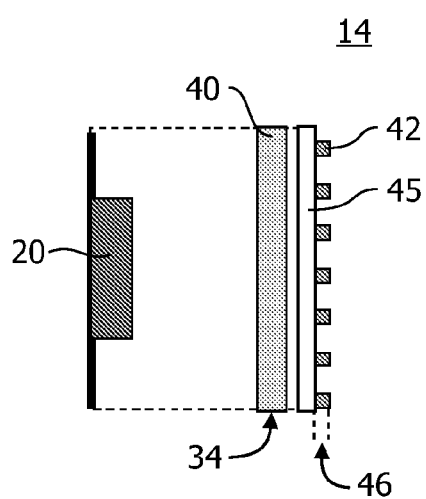

FIG. 1C shows a third embodiment of the light source 14 according to the invention. In this embodiment, the conversion material 42 is applied in a layer 46 on a carrier material 45 which preferably is transparent, and the light conversion element 34 only comprises the luminescent material 40. This carrier material 45 may, for example, be a cover glass 45 of the light source 14, or may, for example, be a lens element 45 of the light source 14, or may, for example, be a further optical element 45 of the light source 14.

Figure 1D:
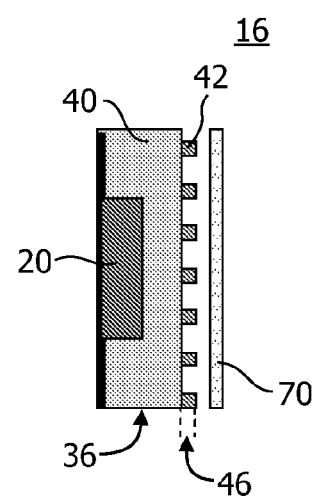

FIG. 1D shows a fourth embodiment of the light source 16 according to the invention. This embodiment shows a light emitter 20 which is completely covered with the light conversion element 36 comprising the luminescent material 40. Such an embodiment is also known as a phosphor-enhanced Light Emitting Diode. On the light conversion element 36 the conversion material 42 is applied in a layer 46 for determining the color appearance of the light source 16 during non-operation.

The embodiment shown in FIG. 1D further comprises a diffuser 70 arranged at a side of the light conversion element 36 facing away from the light emitter 20. This diffuser 70 may be used, for example, to diffuse the regular pattern of conversion material 42 to provide the light source 16 with an appearance such that the color is substantially homogeneous, while the regular pattern may remain relatively large. The diffuser 70 may, of course, also be added to the other embodiments of the light source 10, 12, 14, 16, 18 as shown in FIGS. 1A, 1B, 1C and 1E.

Figure 1E:
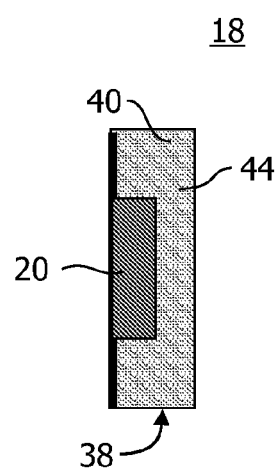

FIG. 1E shows a fifth embodiment of the light source 18 according to the invention. Again the light emitter 20 is encapsulated by the light conversion element 18 which, in the present embodiment, comprises a mixture of the luminescent material 42 and the further luminescent material 44. This further luminescent material 44 substantially does not absorb light of the first color Be.

The embodiments shown in FIGS. 1D and 1E show very compact light sources 16, 18, which comprise phosphor enhanced light sources 16, 18 of which the color appearance is controlled due to the addition of the conversion material 42, 44. The embodiments shown in FIGS. 1A to 1C show embodiments of the light source 10, 12, 14, in which the luminescent material 40 is not directly applied on the light source 10, 12, 14 but applied remote from the light source 10, 12, 14, resulting in a so-called remote phosphor arrangement.

Figure 2B:
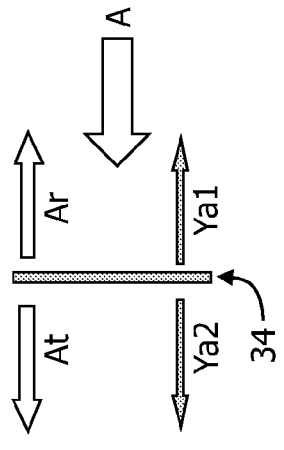
FIGS. 2A and 2B show the situation without the conversion material and FIGS. 2C and 2D show the situation with the conversion material present.
Figure 2D:
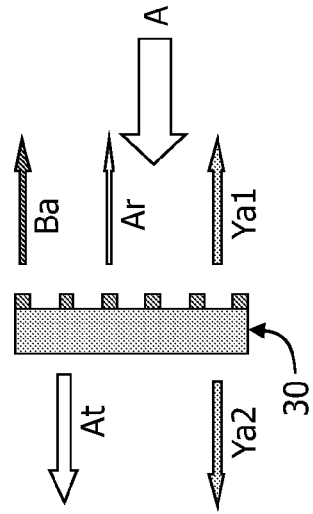
Figure 2A:
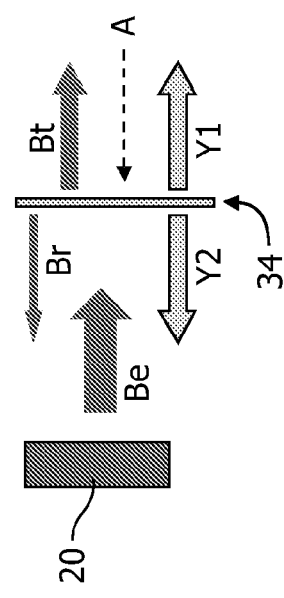
Figure 2C:
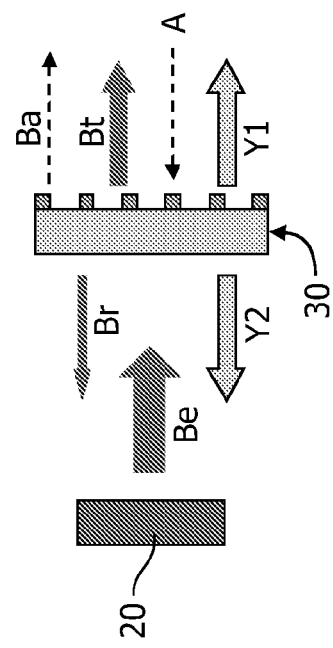

FIGS. 2A, 2B, 2C and 2D each show the conversion of light when the light emitter 20 is 'on' or 'off'. The arrows show light emitted from the conversion element 30, 34, wherein the width of the arrows provide an indication of the intensity of the light. FIGS. 2A and 2B show the situation without the conversion material 42 and FIGS. 2C and 2D show the situation with the conversion material 42 present.

FIG. 2A shows the conversion of light for a conversion element 34 without conversion material 42 when the light emitter 20 is 'on'. This may, for example, represent a known phosphor-enhanced light emitting diode. The light emitter 20 emits light of the first color Be indicated with reference character Be, for example, light of the color blue. The light conversion element 34 converts part of the impinging light of the first color Be into light of the second color Y1, Y2. Because the light conversion element 34 comprises luminescent material 40 for the conversion of the light of the first color Be into light of the second color Y1, Y2, the light of the second color Y1, Y2 is emitted substantially in all directions (indicated in FIG. 2A with arrows Y1 and Y2 pointing in opposite directions). A part of the impinging light of the first color Be is reflected from the light conversion element 34 and reflected back to the light emitter 20, indicated with the arrow having reference character Br. The remainder of the light of the first color Be is transmitted by the light conversion element 34 and is indicated with an arrow having reference character Bt and progresses away from the light emitter 20. The light which is emitted from the light source when the light emitter 20 emits light is a combination of the transmitted light of the first color Bt and of the converted light of the second color Y1. In the current example, the emitted light substantially has the color white. In FIG. 2A a dashed arrow having reference character A represents ambient light A which impinges on the light conversion element 34 from the surroundings of the light source. However, the intensity of this ambient light A compared to the intensity of the light emitted by the light emitter 20 is almost negligible. This is different in the next figure.

FIG. 2B shows the conversion of light for a conversion element 34 without conversion material 42 when the light emitter 20 is 'off'. The width of the arrows in this figure are enhanced compared to the width of the arrows in the previous figure to make the effect of the impinging ambient light A visible. The intensity of the impinging ambient light A for both the FIGS. 2A and 2B typically is the same. Part of the ambient light A which impinges on the light conversion element 34 will be transmitted, which is indicated with a white arrow having reference character At, and a part of the ambient light A will be reflected from the light conversion element 34, which is indicated with a white arrow having reference character Ar. However, due to the presence of the luminescent material 40 in the light conversion element 34, part of the ambient light A will be converted into light of the second color Ya1, Ya2, which again is emitted in all directions. A viewer looking at the light source will perceive both the reflected ambient light Ar and the ambient light converted into light of the second color Ya1, and thus the overall color perceived by a viewer is a mixture of the ambient light Ar and light of the second color Ya1, being yellow in this example. The viewer will perceive the light source as yellow.

FIG. 2C shows the conversion of light for a conversion element 30 having conversion material 42 according to the invention when the light emitter 20 is 'on'. The light emitter 20 emits light of the first color Be indicated with reference character Be, for example, light of the color blue. The light conversion element 30 converts part of the impinging light of the first color Be into light of the second color Y1, Y2, and reflects part of the impinging light of the first color Be back (bearing reference character Br), similar to what is shown in FIG. 2A. The remainder of the light of the first color Be is transmitted by the light conversion element 30 and is indicated with an arrow having reference character Bt. Again, the dashed arrow indicates the ambient light A impinging on the light conversion element 30. In this embodiment, due to the presence of the conversion material 42, part of the ambient light A will be converted into light of the third color Ba, indicated in FIG. 2C with a dashed arrow having reference character Ba. The light which is emitted from the light source when the light emitter 20 emits light is a combination of the transmitted light of the first color Bt and of the converted light of the second color Y1 and the converted light of the third color Ba. However, generally the intensity of the ambient light A is much lower than the intensity of the light emitted by the light emitter 20, and thus the contribution of the third color Ba, which is a predetermined part of the impinging ambient light A, may be negligible to the color of the light emitted by the light source 10. So, again, in the current example in which the light emitter 20 emits light, the color of the light emitted by the light source 10 substantially has the color white.

FIG. 2D shows the conversion of light for a conversion element 30 having conversion material 42 according to the invention when the light emitter 20 is 'off'. Again, the width of the arrows in this figure are enhanced compared to the width of the arrows in the previous figure to make the effect of the impinging ambient light A visible. The intensity of the impinging ambient light A for both the FIGS. 2C and 2D typically is the same. Part of the ambient light A which impinges on the light conversion element 30 will be transmitted, which is indicated with a white arrow having reference character At, and a part of the ambient light A will be reflected from the light conversion element 30, which is indicated with a white arrow having reference character Ar. Due to the presence of the luminescent material 40 in the light conversion element 30, part of the ambient light A will be converted into light of the second color Ya1, Ya2. A further contribution to the emitted light of the light source 10 when the light emitter 20 does not emit light is that part of the ambient light A that is converted into light of the third color Ba due to the presence of the conversion material 42. Now, the contribution of the light of the third color Ba still is a predefined part of the impinging ambient light A, but due to the absence of the light of the first color Be, this light of the third color Ba is NOT negligible but determines a color of the light source 10 as perceived by a viewer. The viewer, looking at the light source, will perceive both the reflected ambient light Ar and the ambient light converted into light of the second color Ya1 and the ambient light converted into the third color Ba, and thus the overall color perceived by a viewer is a mixture of the ambient light Ar, light of the second color Ya1 (being yellow in this example) and light of the third color Ba (being blue in this example). The viewer will perceive the light source 10 as substantially white, both when the light emitter 20 does emit light and when the light emitter 20 does NOT emit light.

FIGS. 3A, 3B, 3C and 3D show different regular patterns in which the conversion material 42 may be applied on the light conversion element 30, 36.

Figure 3A:
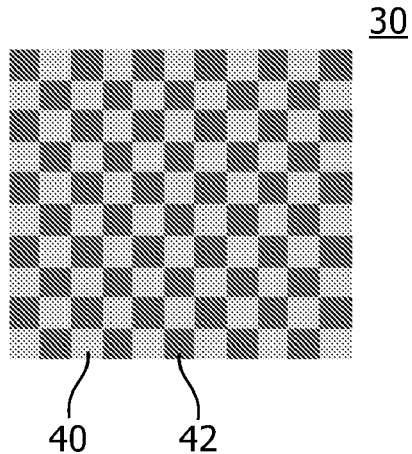
FIGS. 3A, 3B, 3C and 3D show different regular patterns in which the conversion material may be applied.

FIG. 3A shows a relatively large checkerboard pattern of alternating patches of luminescent material 40 and conversion material 42. This relatively large checkerboard pattern will probably be visible to a viewer.

Figure 3B:
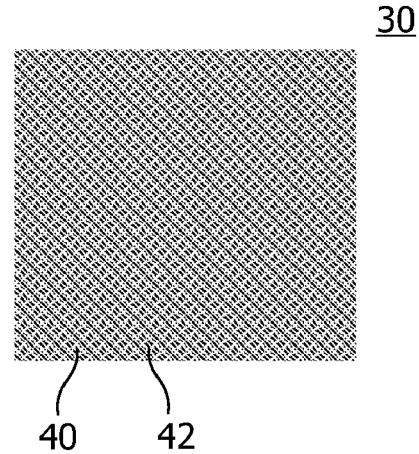

FIG. 3B shows a much smaller checkerboard pattern of alternating patches of luminescent material 40 and conversion material 42. This reduced size of the checkerboard pattern may result in a surface which is perceived as a substantially homogeneous color by the viewer.

Figure 3C:
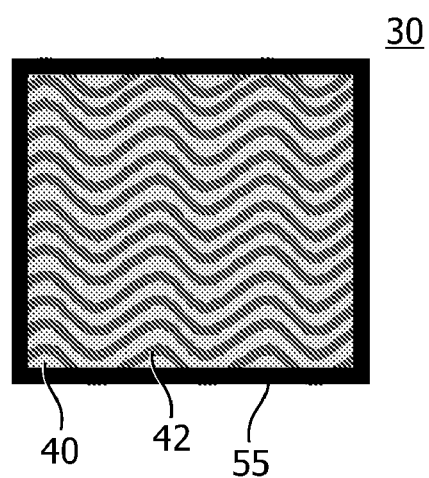

FIG. 3C shows a wavy pattern of alternating lines of luminescent material 40 and conversion material 42. These alternating lines of conversion material 42 may enhance the cooling of the luminescent material 40 when the light emitter 20 is emitting light. These wavy lines of conversion material 42 may include a substantially wavy pattern of mirrors (see FIGS. 4A and 4B). Using, for example, the relatively good heat conductivity of the metal layers of the mirror, heat of the light conversion element 30 resulting from the luminescent material 40 may be guided away from the light conversion element 30, for example, towards a heat sink 55 surrounding the light conversion element 30.

Figure 3D:
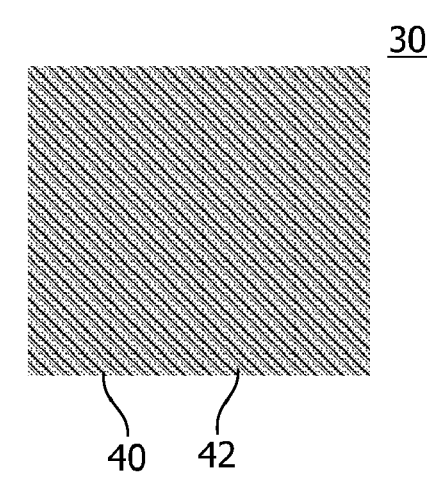

FIG. 3D shows a line-pattern of alternating lines of luminescent material 40 and conversion material 42. When the light conversion element 30 is arranged vertically (as indicated in the picture) and if, during operation, the temperature of the luminescent material 40 increases, the arrangement of the alternating lines of the conversion material 42 applied on top of the luminescent material 40 causes an air flow along the light conversion element 30. This enhances the cooling of the light conversion element 30 when the light emitter 20 emits light, thereby improving the efficiency of the light source 10.

Figure 4A:
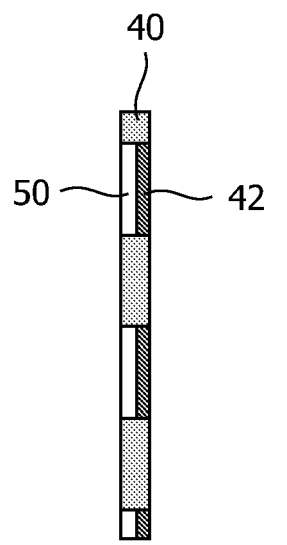
FIGS. 4A and 4B show a part of the light conversion element comprising a mirror layer for recycling light of the first color and light of the second color.
Figure 4B:
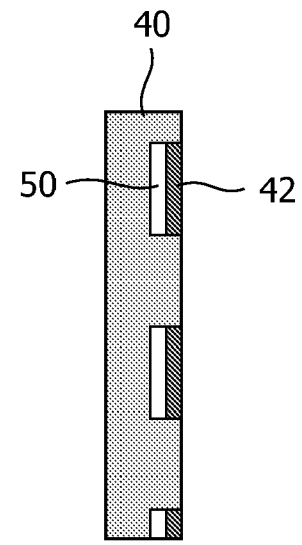

FIGS. 4A and 4B show a part of a cross-sectional view of the light conversion element, in which a mirror layer 50 is applied between the conversion material 42 and the light emitter 20 (not shown). In FIG. 4A, the mirror layer 50 recycles light of the first color Be, allowing the recycled light to be emitted via the luminescent material 40 and partially converted into light of the second color Y1. Furthermore, the mirror layer 50 prevents light of the first color to directly impinge on the conversion material 42. In FIG. 4B, part of the luminescent material 40 is also arranged between the mirror layer 50 and the light emitter 20, and the mirror layer 50 recycles light of the first color Be and light of the second color Y1 back into the light source 10 such that the latter may be emitting, after recycling, between two patches of conversion material 42. Furthermore, the mirror layer 50 may be used to prevent light of the first color Be from directly impinging on the conversion material 42.

Figure 5:
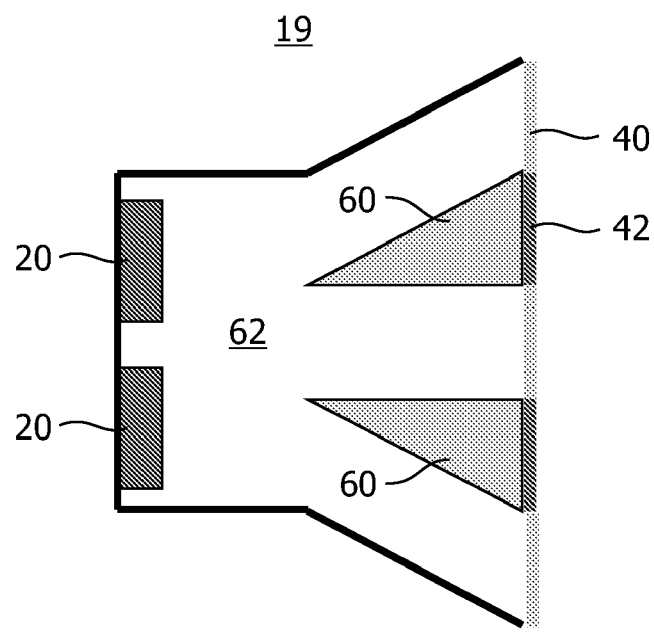
FIG. 5 shows an embodiment of the light source in which light guiding elements are applied for guiding the light of the first color away from the conversion material.

FIG. 5 shows an embodiment of the light source 19 in which light guiding elements 60 are applied for guiding the light of the first color Be away from the conversion material 42 towards the luminescent material 40. Furthermore, the light guiding elements 60 are arranged for preventing directly impinging light of the first color Be emitted by the light emitter 20. In the embodiment shown in FIG. 5, the light source 19 comprises two light emitters 20 which, for example, both emit light of substantially the same color Be.

Alternatively, the light emitters 20 may emit light of different colors. By using the light guiding elements 60, the area of the luminescent material 40 used to convert the emitted light of the light emitters 20 may remain the same as when no conversion materials 42 would have been present, generating substantially the same conversion characteristics of the light source 19 with or without conversion material 42. Due to the addition of the conversion material 42, the appearance of the light source 19 may be adapted and may be controlled to be substantially identical to the color of the light emitted by the light source 19 when the light emitters 20 emit light. In a preferred embodiment, the light guiding elements 60 guide the major part of the light via total internal reflection, resulting in a reduction of the losses of the light source 19. To achieve this, the light emitters 20 may be placed in a light guide 62. The light guiding elements 60, for example, form parts of the light guide 62 and comprise a material having a reduced refractive index compared to the refractive index of the light guide 62. This may, for example, be achieved by using air-filled chambers as the light guiding elements 60.

Figure 6:
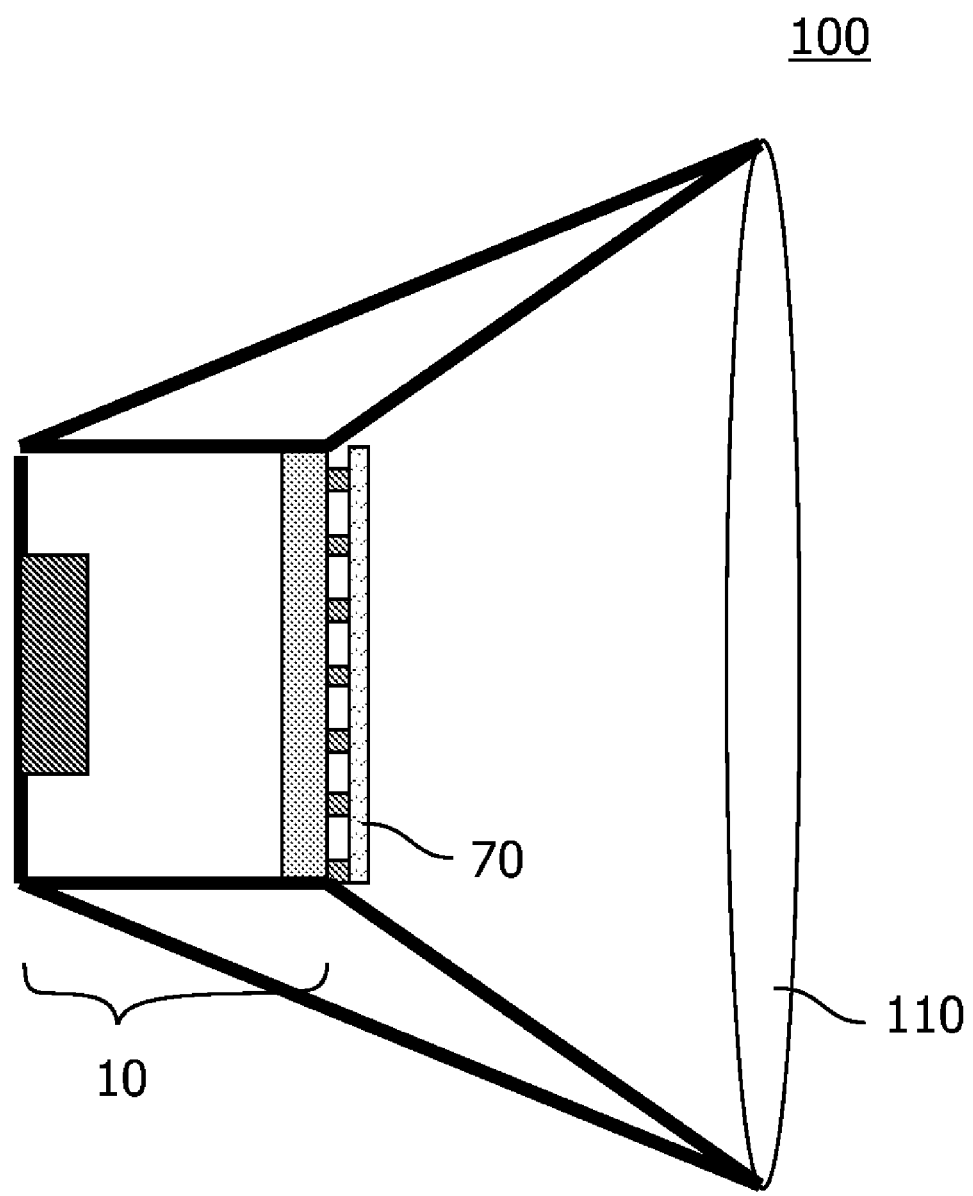
FIG. 6 shows an illumination system according to the invention.

FIG. 6 shows an illumination system 100 according to the invention. The illumination system 100 comprises the light source 10 together with, for example, refractive optics 110 to shape the beam of light emitted by the light source 10. In the light source 10 as shown in FIG. 6 a diffuser 70 is added. This diffuser 70 may be used to generate a substantially homogeneous appearance of the light source 10, while the regular structure of conversion material 42 may remain relatively large.

It should be noted that the above-mentioned embodiments illustrate rather than limit the invention, and that those skilled in the art will be able to design many alternative embodiments without departing from the scope of the appended claims.

In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. The invention may be implemented by means of hardware comprising several distinct elements. In the device claim enumerating several means, several of these means may be embodied by one and the same item of hardware. The mere fact that certain measures are recited in mutually different dependent claims does not indicate that a combination of these measures cannot be used to advantage.

The invention claimed is:

1. Light source having a predefined external appearance during non-operation, the light source comprising
   a light emitter
   a light conversion element, the light emitter emitting visible light of a first color (Be) via the light conversion element in a direction away from the light source, the light conversion element comprising a first luminescent material for converting at least a part of the light of the first color (Be) into light of a second color (Y1, Y2) different from the first color (Be),
   a conversion material for converting at least a part of ambient light (A) originating from outside of the light source impinging on the conversion material into light of a third color (Ba) different from the second color (Y1, Y2), the conversion material being at least partially to a surface of the light conversion element, facing away from the light emitter, in a first regular pattern defining openings in between adjacent parts of conversion material, through which light of the first color (Be) and light of the second color (Y1, Y2) are emitted from the light conversion element, and a mirror layer applied in a second regular pattern corresponding to the second regular pattern of the conversion material, the mirror layer being disposed between the conversion material and the light emitter for improving the efficiency of the light source by recycling light of the first color (Be) and light of the second color (Y1, Y2).

2. Light source as claimed in claim 1, wherein the conversion material is configured to absorb at least part of the impinging ambient light (A) and reflect the remainder of the impinging ambient light (A) for generating the third color (Ba).

3. Light source as claimed in claim 1, wherein the conversion material comprises a second luminescent material substantially shielded from direct impinging light emitted by the light emitter, the second luminescent material converting at least part of the impinging ambient light (A) into light of the third color (Ba).

4. Light source as claimed in claim 3, wherein the light source comprises light guiding elements (60) for guiding light of the first color (Be) away from the conversion material towards the first luminescent material.

5. Light source as claimed in claim 1, wherein the relative dimension between the conversion material and the openings in the regular pattern is selected for preventing the regular pattern from being visible to the human eye during operation and non-operation.

6. Light source as claimed in claim 1, wherein a part of the first luminescent material is applied between the mirror layer (50) and the light emitter.

7. Light source as claimed in claim 1, wherein the first regular pattern of conversion material is chosen for improving the cooling of the first luminescent material in the light conversion element.

8. Light source as claimed in claim 1, wherein the conversion material comprises a second luminescent material that substantially does not absorb the first color (Be).

9. Light source as claimed in claim 8, wherein the second luminescent material is mixed with the first luminescent material in the light conversion element.

10. Light source as claimed in claim 1, wherein the light conversion element is arranged remote from the light emitter.

11. Light source as claimed in claim 1, wherein the light source further comprises a diffuser arranged at a side of the light conversion element facing away from the light emitter.

* * * * *